United States Patent
Marya

(10) Patent No.: US 11,213,887 B2
(45) Date of Patent: Jan. 4, 2022

(54) ULTRA HARD ELECTRICALLY-RESPONSIVE AND ENVIRONMENTALLY RESISTANT METALS FOR OILFIELD SERVICES

(71) Applicant: Schlumberger Technology Corporation, Sugar Land, TX (US)

(72) Inventor: Manuel Marya, Sugar Land, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 16/025,735

(22) Filed: Jul. 2, 2018

(65) Prior Publication Data

US 2020/0001358 A1 Jan. 2, 2020

(51) Int. Cl.
*B22F 1/00* (2006.01)
*B22F 1/02* (2006.01)
*B22F 3/02* (2006.01)

(52) U.S. Cl.
CPC .............. *B22F 1/007* (2013.01); *B22F 1/025* (2013.01); *B22F 3/02* (2013.01); *B22F 2003/023* (2013.01)

(58) Field of Classification Search
CPC .. B22F 1/007; B22F 1/025; B22F 3/02; B22F 2003/023
See application file for complete search history.

(56) References Cited

U.S. PATENT DOCUMENTS

| | | | | |
|---|---|---|---|---|
| 7,533,738 | B1* | 5/2009 | Hall | E21B 10/633 175/327 |
| 2005/0034559 | A1* | 2/2005 | Lindenau | B22F 1/0003 75/249 |
| 2005/0109158 | A1* | 5/2005 | Keener | B22F 1/0044 75/352 |
| 2007/0297934 | A1* | 12/2007 | Margam | C22C 14/00 420/418 |
| 2014/0087210 | A1* | 3/2014 | Keane | B22F 3/02 428/810 |

OTHER PUBLICATIONS

Xu et al., "Effect of Sliding Speed and Applied Load on Dry Sliding Tribological Performance of TiAl Matrix Self-lubricating Composites", Tribo Lett (2014) 55:292-404, Jul. 10, 2014 (Year: 2014).*
Xu et al., "Effect of Sliding Speed and Applied Load on Dry Sliding Tribological Performance of TiAl Matrix Self-lubricating Composites", Tribo Lett (2014) 55:292-404, Jul. 10, 2014 (Year: 2014).*
(Continued)

*Primary Examiner* — Daniel J. Schleis
*Assistant Examiner* — Kevin CT Li
(74) *Attorney, Agent, or Firm* — Jaime Castano

(57) ABSTRACT

A consolidated material formed by powder metallurgy is provided. The consolidated material includes particles of a first component consolidated with particles of a second component. The first component is a transition metal selected from group 4, group 5, group 6, or group 7 of the periodic table of the elements, or an alloy thereof. The second component is a solid lubricant. Also provided is a method of making the consolidated material and articles made from the consolidated material.

19 Claims, 6 Drawing Sheets

(56) References Cited

OTHER PUBLICATIONS

Zhang et al., "Friction and wear behavior of laser cladding Ni/hBN self-lubricating composite coating", Materials Science and Engineering A 491 (2008) 47-54, accepted Dec. 12, 2007 (Year: 2007).*
Berman et al., Graphene: a new emerging lubricant, Materials Today, vol. 17, No. 1, Jan./Feb. 2014, pp. 31-42.
Torres et al., Tribological behaviour of self-lubricating materials at high temperatures, International Materials Reviews, 2017 (33 pages).
Gupta et al., Ambient and 550° C tribological behavior of select MAX phases against Ni-based superalloys, WEAR, 2008, pp. 270-278.
Kova'cik et al., Effect of composition on friction coefficient of Cu-graphite composites, WEAR 265, 2008, pp. 417-421.
Friedman et al., Fabrication of self-lubricating cobalt coatings on metal surfaces, Nanotechnology, 18 (2007) 115703 (8 pages).
Jiang et al., Tribological behavior of a novel fullerene complex, WEAR 264, 2008, pp. 264-269.

* cited by examiner

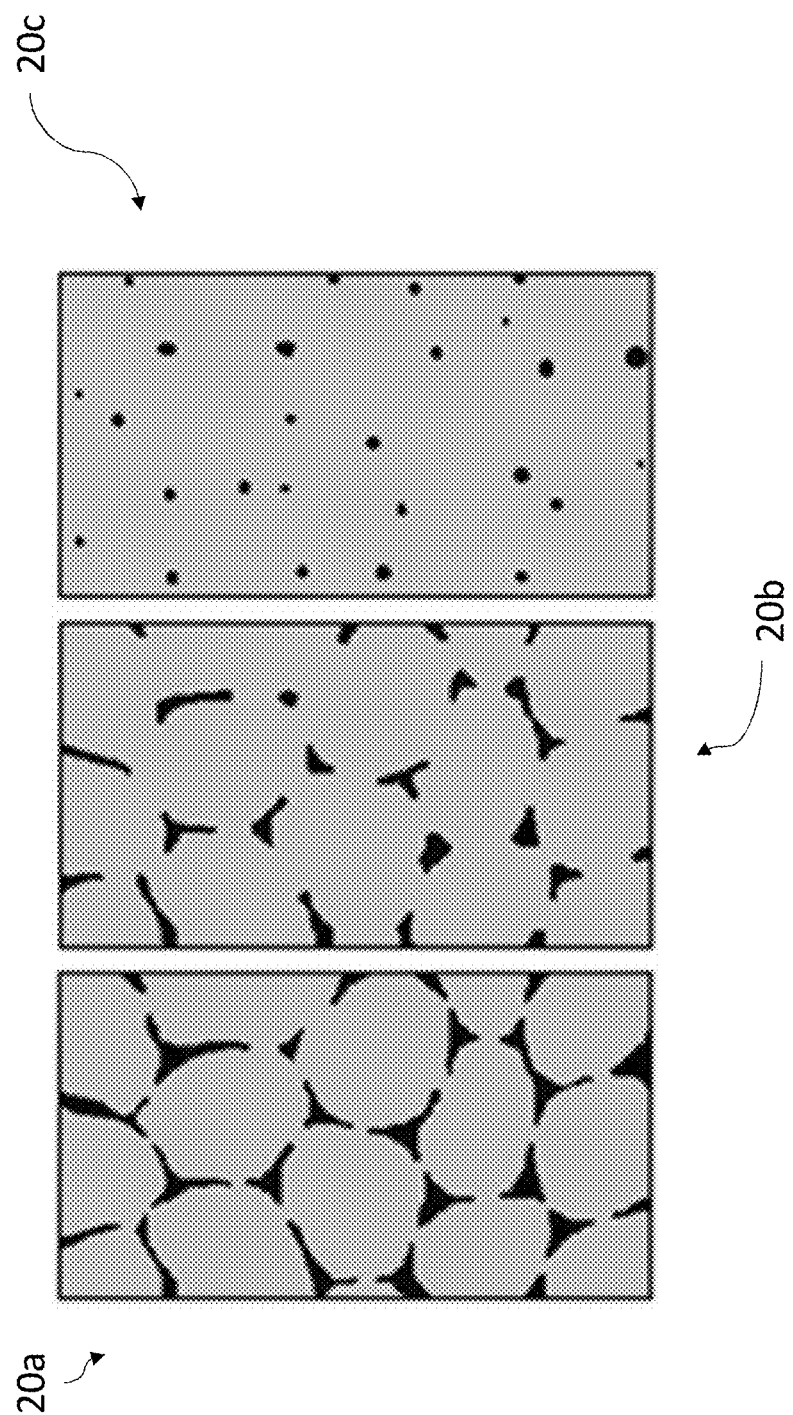

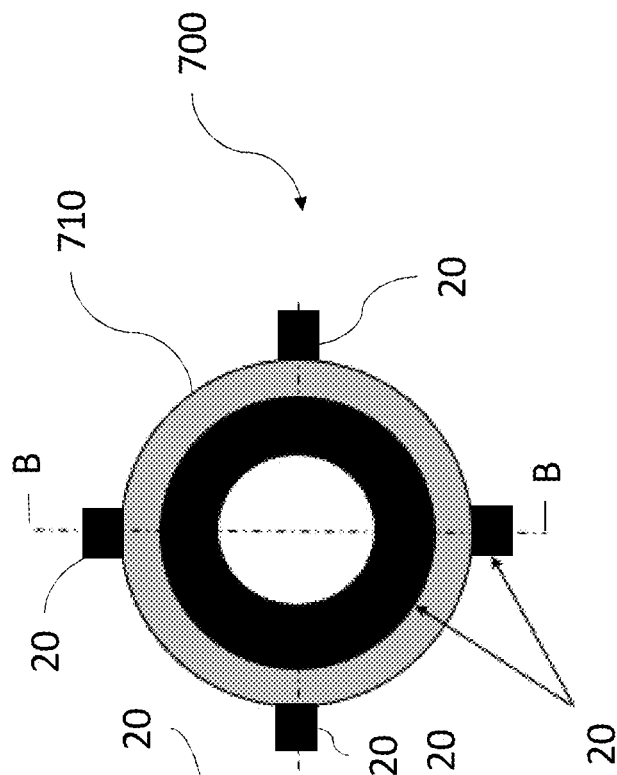
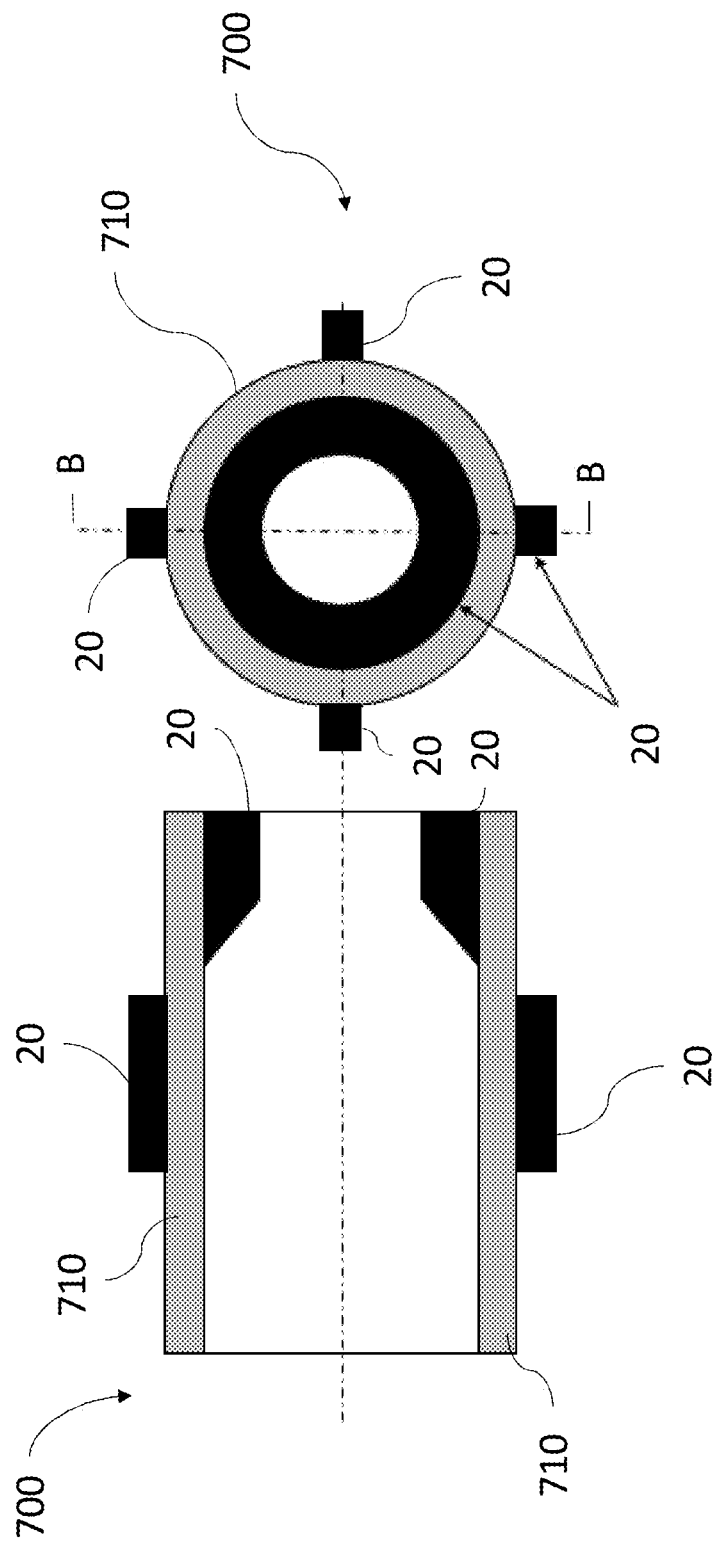
FIG. 7A
FIG. 7B

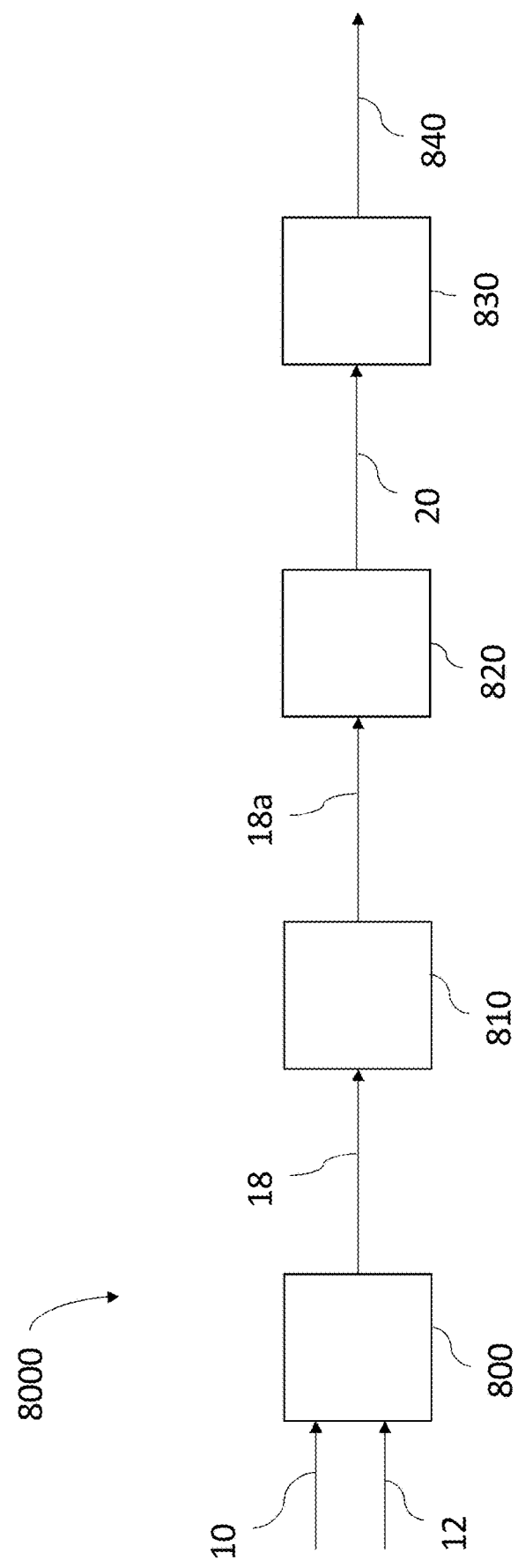

ULTRA HARD ELECTRICALLY-RESPONSIVE AND ENVIRONMENTALLY RESISTANT METALS FOR OILFIELD SERVICES

FIELD

The present disclosure relates to metal and metal containing composites for use in oilfield services, articles of manufacture made from such metals and composites, and to methods of making and using the same.

BACKGROUND

In oilfields, hard materials are used for components in service applications in which wear resistance is desired to avoid early-life termination of such components due to abrasion, erosion, and other forms of wear phenomena. Cermets (carbide-metal composites), such as tungsten carbide cermets, are often used in such oilfield components for service applications that require wear resistance. In comparison to some conventional metal and alloy materials used in such applications, tungsten carbide cermets are harder and more wear-resistant. While, in comparison to some conventional ceramics used in such applications, tungsten carbide cermets are softer and, thus, more limited in abrasive wear situations. The selection of material for use in a particular component amongst conventional materials involves tradeoffs amongst various properties, including hardness, fracture toughness, transverse rupture strength (TRS), thermal conductivity, and electrical resistivity.

Tungsten carbide cermets are considered to combine some of the mechanical properties of ceramics and of metals or alloys. However, tungsten carbide cermets have technical deficiencies when used for certain oilfield applications. One deficiency of tungsten carbide cermets, when used for oilfield applications, is a lack of sufficient corrosion resistance. In certain applications, corrosion resistance is critical for longevity of components, particularly in oil and gas production environments, including in deepwater oil and gas wells where acidic corrosive fluids are present. Another deficiency of tungsten carbide cermets, when used for oilfield applications, is a lack of electrical conductivity, as tungsten carbide cermets are predominantly non-metallic, that is composed of a ceramic as a main constituent. In certain oilfield applications, electrical conductivity is beneficial, and sometimes required. For example, rotating equipment animated by inductive coupling, such as turbines and impellers (e.g., pump impellers) are required to be composed of electrically conductive materials. Another deficiency of tungsten carbide cermets, when used for oilfield applications, is a lack of thermal conductivity and diffusivity. In certain oilfield applications, thermal conductivity and diffusivity are desirable, such as in high thermal energy density applications where heat extraction is paramount to proper long-term functionality. For example, in some high RPM rotating parts, where friction is detrimental to the part (e.g., rotary face seals, radial bearings, thrust bearings), it is desirable for the part to be composed of a thermally conductive material to avoid thermal reductions in mechanical properties of the part. In addition to insufficient corrosion resistance, electrical conductivity, and thermal conductivity, tungsten carbide cermets are also deficient in fracture toughness (i.e., tungsten carbide cermets are too brittle).

BRIEF SUMMARY

One embodiment of the present disclosure includes a consolidated powder-metallurgy material. The material includes particles of a first component consolidated with particles of a second component. The first component is a transition metal selected from group 4, group 5, group 6, or group 7 of the periodic table of the elements, or an alloy thereof. The second component is a solid lubricant.

Another embodiment of the present disclosure includes an article made from the consolidated powder-metallurgy material.

Another embodiment of the present disclosure includes a method of making the consolidated powder-metallurgy material and articles therefrom. The method includes consolidating the particles of the first component with the particles of the second component.

BRIEF DESCRIPTION OF THE DRAWINGS

So that the manner in which the features of the compositions, articles, and methods of the present disclosure may be understood in more detail, a more particular description briefly summarized above may be had by reference to the embodiments thereof which are illustrated in the appended drawings that form a part of this specification. It is to be noted, however, that the drawings illustrate only various exemplary embodiments and are therefore not to be considered limiting of the disclosed concepts as it may include other effective embodiments as well.

FIG. 5B depicts examples of consolidated microstructures of the consolidated material in accordance with certain embodiments of the present disclosure;

FIG. 7A depicts a cross-sectional view of an article having the consolidated material cladded onto a body of the article along line B-B of FIG. 7B in accordance with certain embodiments of the present disclosure;

FIG. 7B depicts an article formed of a conventional material and cladded with the consolidated material in accordance with certain embodiments of the present disclosure; and FIG. 8 depicts a schematic of a process of forming the powder metal blend, consolidated material, and articles made therefrom.

Composition, articles, and methods according to present disclosure will now be described more fully with reference to the accompanying drawings, which illustrate various exemplary embodiments. Concepts according to the present disclosure may, however, be embodied in many different forms and should not be construed as being limited by the illustrated embodiments set forth herein. Rather, these embodiments are provided so that this disclosure will be thorough as well as complete and will fully convey the scope of the various concepts to those skilled in the art and the best and preferred modes of practice.

DETAILED DESCRIPTION

Certain aspects of the present disclosure provide for compositions, articles of manufacture made from such compositions, and to methods of making and using such compositions and articles.

In some embodiments, the compositions and articles disclosed herein are suitable for use in various applications including oilfield applications, subsea applications, mining applications, and other applications in which wear-resistance, thermal conductivity, electrical conductivity, corrosion-resistance, or combinations thereof are required. In some embodiments, the compositions include materials suitable for replacing tungsten carbide cermets or other ceramic-metal composites currently used in oilfield applications. The material compositions may be tailored to have properties for use in corrosive-service friction and wear applications, including in oilfield environments, such as conventional and deepwater downhole environments or drilling environments. For example, the compositions may be tailored to have a desirable balance of properties including hardness, wear-resistance, corrosion-resistance, strength, toughness, electrical conductivity, and thermal conductivity for use in various oilfield applications and environments.

Material Composition—First Component

Some embodiments of the present disclosure include a powder-metallurgy composition and a consolidated material composition made therefrom.

Figures 1, 2, 3, 4:
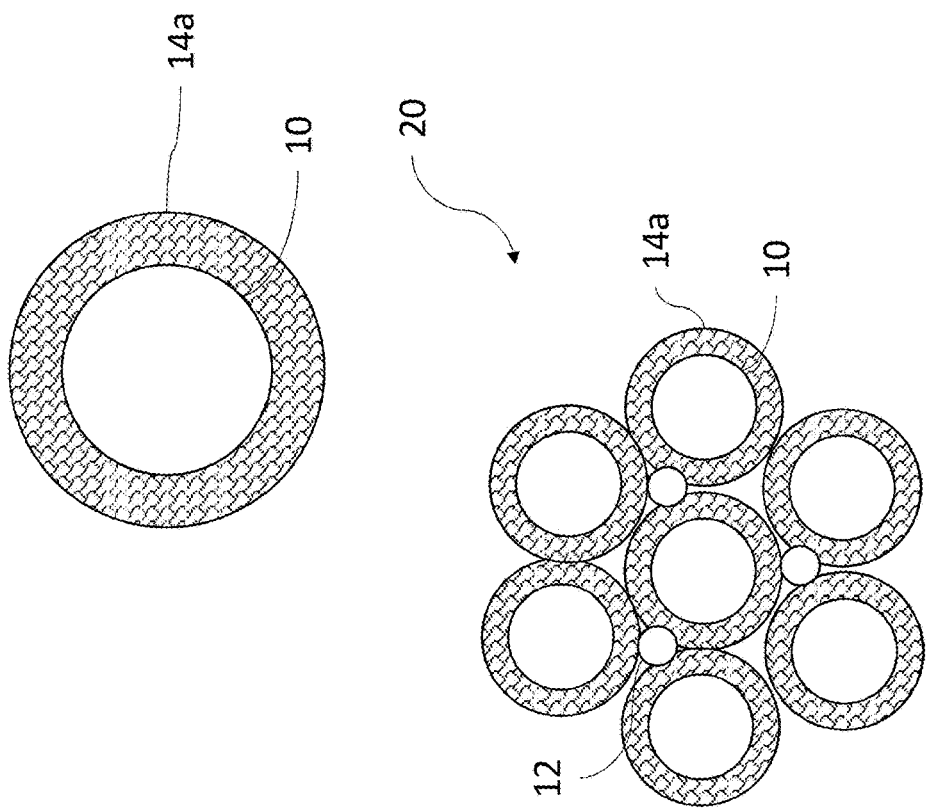
FIG. 1 depicts a metal powder particle in accordance with certain embodiments of the present disclosure.
FIG. 2 depicts a solid lubricant powder particle in accordance with certain embodiments of the present disclosure.
FIG. 3 depicts a metal powder particle having a reacted surface layer in accordance with certain embodiments of the present disclosure.
FIG. 4 depicts a metal powder blend of metal powder and solid lubricant particles before consolidation, and a consolidated material after consolidation of the metal powder blend in accordance with certain embodiments of the present disclosure.

With reference to FIG. 1, the powder-metallurgy composition includes first component 10. First component 10 is a metal or alloy thereof. In some embodiments, first component 10 is in the form of a metal powder (i.e., first powder). Suitable metals and alloys for use as the first component 10 include transition metals and alloys thereof, including transition metals selected from group 4 of the periodic table of the elements and alloys thereof; transition metals selected from group 5 of the periodic table of the elements and alloys thereof; transition metals selected from group 6 of the periodic table of the elements and alloys thereof; and transition metals selected from group 7 of the periodic table of the elements and alloys thereof. As would be understood by one skilled in the art, a metal alloy is an alloy of at least two metals in which the "named" metal of the alloy (e.g., in "titanium alloy" the named metal is "titanium") constitutes at least the plurality of weight percent of the alloy, based on the total weight of the alloy, and, optionally, a majority (i.e., greater than 50 wt. %) of weight percent of the alloy, based on the total weight of the alloy.

In some embodiments, first component 10 is or includes titanium or an alloy thereof, vanadium or an alloy thereof, chromium or an alloy thereof, zirconium or an alloy thereof, niobium or an alloy thereof, molybdenum or an alloy thereof, hafnium or an alloy thereof, tantalum or an alloy thereof, tungsten or an alloy thereof, or rhenium or an alloy thereof. Exemplary vanadium-based alloys or intermetallic compounds for use herein include, but are not limited to, $V_3Si$ and $V_3Ga$, which are electrically superconductive. Exemplary zirconium-based alloys for use herein include, but are not limited to, Zr—Sn and Zr—Nb. Exemplary niobium-based alloys for use herein include, but are not limited to, Nb—Sn ($Nb_3Sn$) and Nb—Ti, which are electrically superconducting. Tungsten and alloys thereof exhibit a relatively high density and are, thus, suitable for use as casing material for downhole logging of oil wells. Also, tungsten and alloys thereof may be pressed and sintered into blanks for making large components, including machine components. Tungsten alloys may also be used to provide for radiation shielding.

In some aspects, first component 10 has a surface composition and chemistry that is different than the bulk composition and chemistry of first component 10. As shown in FIG. 1, in some embodiments particles of first component 10 have at least one surface composition, coating 14, at least partially encapsulating first component 10. Coating 14 may partially or fully encapsulate first component 10. Coating 14 is composed of a different element, compound or composition than first component 10, such as a metal or alloy that is different than the metal or alloy of first component 10. For example, in one exemplary embodiment first component 10 is composed of Nb, W, Mo, or an alloy containing one or more of Nb, W, and Wo, and coating 14 is composed of Sn or an alloy thereof. Coating 14 may be deposited onto first component 10 via chemical vapor deposition (CVD). However, one skilled in the art would understand that application of coating 14 onto first component 10 is not limited to CVD, and that coating 14 may be applied to first component 10 by another method. While coating 14 is shown as a single layer coating, in some embodiments first component 10 includes multiple coatings, which may each be of the same or different compositions. Furthermore, while shown as coated with coating 14, in some embodiments first component 10 is uncoated.

In some aspects, first component 10 is metallic or at least predominantly metallic. In certain embodiments, first component 10 is and does not include ceramic, cermet, or ceramic and cermet.

Material Composition—Second Component

With reference to FIG. 2, the powder-metallurgy composition includes second component 12. Second component 12 may be in the form of a powder (i.e., second powder). In some aspects, second component 12 is a solid lubricant, also referred to as a dry lubricant.

Second component 12 may be non-metallic or metallic. In some embodiments, second component 12 is or includes a relatively low-melting point metal or alloy, such as a post-transition metal or a metalloid. In certain aspects, second component 12 is or includes a metal and a non-metal that have an electronegativity difference (Pauling scale) that is greater than 0.5 (e.g., a metal-sulfide, a metal-phosphide, or a metal-nitride). In some such embodiments second component 12 is or includes a sulfide, fluoride, nitride, or carbon structure. For example, second component 12 may be a metal-sulfide compound, such as $MoS_2$ or $WS_2$; a metal-phosphide compound; a metal-nitride compound, such as boron nitride; a carbon-based material, such as graphene, graphite, or buckyballs (fullerenes); or a 2D-material with lubricative properties.

Solid Lubricants—Soft Metals

In certain embodiments, second component 12 is or includes a metal or alloy thereof. In some such embodiments, second component 12 is or includes a soft metal, such as indium or an alloy thereof, tin or an alloy thereof, lead or an alloy thereof, silver or an alloy thereof, gold or an alloy thereof, copper or an alloy thereof, or bismuth or an alloy thereof. In some such embodiments, the soft metal is present in an amount ranging from 5 to 30 volume percent, based on the total volume of the first and second components.

Solid Lubricants—Transition Metal Dichalcogenides

In some embodiments, second component 12 is or includes a transition metal dichalcogenide, such as $MoS_2$, $WS_2$, or $MoSe_2$, which may be present in an amount of at least 5 volume percent, based on the total volume of the first and second components.

Solid Lubricants—Oxides

In some embodiments, second component 12 is or includes a metal oxide, such as a binary or ternary oxide. For example, second component 12 may be MgO, FeO, $Fe_2O_3$, $ZrO_2$, $Al_2O_3$, $B_2O_3$, $Re_2O_7$, PBO, $MoO_3$, $WO_3$, CuO, $V_2O_5$, $Ag_2MoO_4$, $Ag_2WO_4$, or $Ag_3VO_4$, which may be present in an amount of from 5 to 35 volume percent, based on the total volume of the first and second components.

Solid Lubricants—Carbon

In some embodiments, second component 12 is or includes carbon or a carbon-based material, such as graphite, diamonds, diamond-like carbon (DLC), carbon nanotubes, fullerene, or graphene, which may be present in an amount of from 5 to 35 volume percent (by surface). In some such embodiments, the distance between grains in the microstructure of such carbon-based solid lubricants is comparable or smaller than that in erosion and abrasive particles used in oilfields, such as sand. The material grain size of such carbon-based solid lubricants is smaller than that of sand particles used in oilfields as erosion and abrasive particles.

Solid Lubricants—Others

In some embodiments, second component 12 is or includes alkaline-earth fluorides, such as $CaF_2$ or $BaF_2$. In some embodiments, second component 12 is or includes hexagonal boron nitride (hBN), which may be present in an amount of from 5 to 50 or 5 to 35 volume percent, based on the total volume of the first and second components. In some embodiments, second component 12 is or includes a MAX phase, such as $Ti_3SiC_2$ or $Ti_2SnC$, which are inert. As would be understood by one skilled in the art, MAX phases are layered, hexagonal carbides and nitrides having the general formula: $M_{n+1}AX_n$, where n=1 to 3, M is an early transition metal, A is an A-group (mostly IIIA and IVA, or groups 13 and 14) element, and X is either carbon and/or nitrogen.

Material Composition—Blended Components

With reference to FIG. 4, the powder-metallurgy composition includes metal powder blend 18, which is a blend of at least two components including first component 10 and second component 12, both in the form of powders. Metal powder blend 18 may be formed by blending a plurality of powder particles of first component 10 (coated or uncoated) with a plurality of powder particles of second component 12. As shown in FIG. 4, the powder particles of second component 12 are situated between the powder particles of first component 10. In some embodiments, the powder particles of first component 10 have an average particle size that is greater than the average particle size of the powder particles of second component 12. In certain embodiments, first component 10 is composed of a metal powder, where each powder particle has a diameter that is less than 1 μm.

In certain embodiments, metal powder blend 18 includes at least 50% by volume, or at least 60% by volume, or at least 70% by volume, or at least 80% by volume, or at least 85% by volume, or at least 90% by volume, or at least 95% by volume, or at least 98% by volume, or at least 99% by volume of first component 10, based upon a total volume of the first component and the second component. In some such embodiments, metal powder blend 18 includes at most 50% by volume, or at most 40% by volume, or at most 30% by volume, or at most 20% by volume, or at most 15% by volume, or at most 10% by volume, or at most 5% by volume, or at most 2% by volume, or at most 1% by volume of second component 12, based upon the total volume of the first component and the second component.

Material Composition—Consolidated Material

After blending, metal powder blend 18 may be consolidated, forming consolidated material 20. Consolidated material 20 is a bulk, rigid, solid material composed of a consolidated mass of first component 10 and second component 12. As the metals of first component 10 have relatively high-melting temperatures, consolidation 400 may be performed via powder metallurgy techniques, which may include the subjection of metal powder blend 18 to increased temperature over a period of time and, optionally, to increased pressure over the period of time to consolidate metal powder blend 18. For example, the metal powders of metal powder blend 18 may be hydrostatically compacted and sintered at a temperature that is equal to or greater than 2000° C. In some embodiments, consolidation 400 is performed without the use of pressure.

Consolidation 400 results in sintering or joining of the particles of first component 10 with adjacent particles of second component 12, sintering or joining of the particles of first component 10 with adjacent particles of first component 10, sintering or joining of the particles of second component 12 with adjacent particles of second component 12, or combinations thereof. In some such embodiments, as shown in FIG. 4, the particles of second component 12 are positioned between multiple particles of first component 10 and are sintered or joined therewith. Consolidation 400 converts metal powder blend 18 from a powder composition into a rigid, solid, bulk composition.

With reference to FIG. 3, in some embodiments, where first component 10 includes coating 14, subjection of first component 10 to conditions sufficient for consolidation (e.g., increased temperature, and optionally pressure, over a period of time) provides first component 10 with an at least partially reacted surface layer 14a. For example, during consolidation of metal powder blend 18, the consolidation conditions (e.g., temperature, pressure, and time) may be sufficient to initiate chemical reaction between the metal alloy of first component 10 and the element or compound (e.g., metal or alloy) of coating 14. For example, if first component 10 is composed of a first metal, Metal[1], and coating 14 is composed of a second metal, Metal[2], during consolidation first metal and second metal may react to form a compound. A generalized reaction sequence for reaction between Metal[1] of first component 10 and Metal[2] of coating 14 is set forth below.

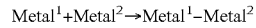

$$Metal^1 + Metal^2 \rightarrow Metal^1 - Metal^2$$

In some aspects, reaction between first component 10 and coating 14 is an exothermic reaction that, by providing heat, facilitates consolidation of metal powder blend 18, such as in lower temperature consolidation techniques.

In some embodiments, second component 12 is infiltrated into first component 10 within consolidated material 20, after consolidation of metal powder blend 18. In some aspects, infiltration of second component 12 (e.g., solid lubricant) into first component 10 within consolidated material 20 entraps second component 12 at least in a surface region of first component 10. In some embodiments, a solid lubricant is infiltrated, embedded, or otherwise incorporated into first component 10, optionally at room temperature, after consolidation of first component, and is entrapped at least in a surface region of first component 10. In some such embodiments, after infiltration of the solid lubricant, first component 10 is subjected to a further consolidation. For example, Pb or an alloy thereof, Sn or an alloy thereof, Au or an alloy thereof, Ag or an alloy thereof, or Cu or an alloy thereof may be entrapped at least in a surface region of first component 10. Incorporation of solid lubricants into consolidated material 20 provides consolidated material 20 with self-lubricating properties and enhanced wear characteristics. In some such aspects, incorporation of solid lubricants into consolidated material 20 provides consolidated material 20 with wear characters that are the same or substantially similar to wear characteristics of a ceramic material, while also being electrically and thermally conductive.

In some embodiments, after consolidation, consolidated material 20 is pressure infiltrated into a porous or at least partially porous solid. For example, in some such embodiments consolidated material 20 is pressure infiltrated if second component 12 is relatively unstable at high temperatures and has a relatively low melting point (e.g., certain sulfides and phosphides are relatively unstable at high temperatures and have relatively low melting points).

Powder metal blend 18, consolidated material 20, and articles made therefor may be metallic or at least predominantly metallic. In certain embodiments, articles made at least partially from consolidate material 20 do not include ceramic, cermet, or ceramic and cermet.

Consolidated Material—Properties

In certain aspects, consolidated material 20, and articles made therefrom, exhibit or are characterized by a hardness of from 70 to 95 HRA, or from 75 to 90 HRA, or from 80 to 85 HRA, as determined in accordance with the Rockwell test on the Rockwell scale A. As would be understood by one skilled in the art, the Rockwell hardness test may be performed in accordance with ISO 6508-1: Metallic materials—Rockwell hardness test—Part 1, which provides test method for scale A.

In certain aspects, consolidated material 20, and articles made therefrom, exhibit or are characterized by a fracture toughness of from 10 to 30 MPa×m$^{1/2}$, or from 15 to 25 MPa×m$^{1/2}$, or from 18 to 20 MPa×m$^{1/2}$, as determined in accordance with the Palmqvist method, as set forth in ISO 28079:2009.

In certain aspects, consolidated material 20, and articles made therefrom, exhibit or are characterized by a TRS (also referred to as flexural strength) in excess of 200 ksi as determined in accordance with ASTM C1161 18.

In certain aspects, consolidated material 20, and articles made therefrom, exhibit or are characterized by corrosion resistance, electrical conductivity, thermal conductivity and diffusivity, tribological wear resistance, or combinations thereof.

Consolidated Material—Internal Substructure

Figure 5A:
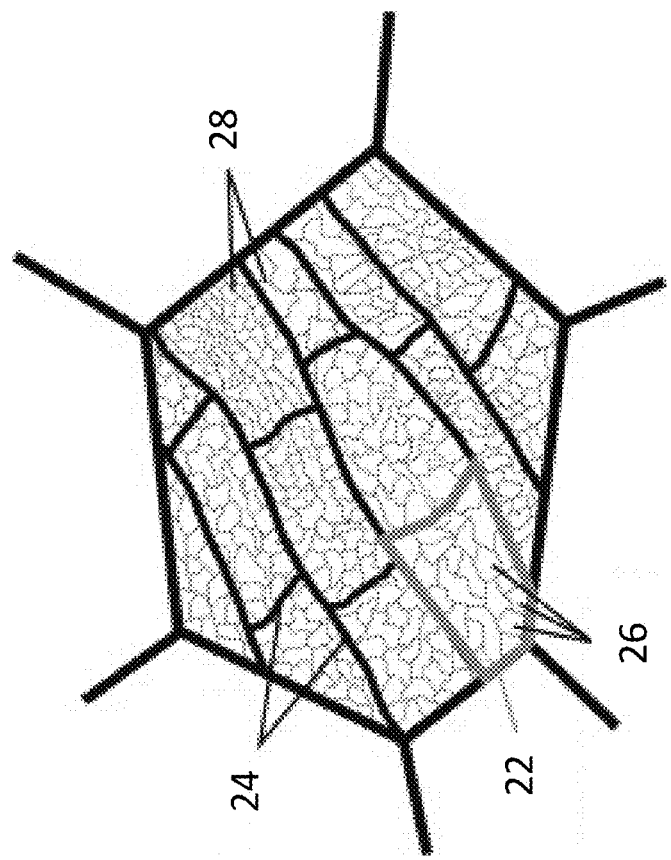
FIG. 5A depicts grain and sub-grain structure of the consolidated material in accordance with certain embodiments of the present disclosure.
Figure 5A:
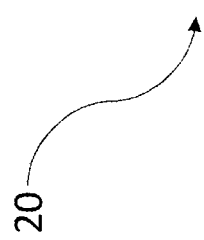

With reference to FIG. 5A, in some embodiments consolidated material 20 has an inhomogeneous or nonuniform internal substructure (microstructure or morphology), such that consolidated material 20 varies in composition and/or properties along grain and sub-grain boundaries (i.e., non-uniform grain and sub-grain structures). FIG. 5A depicts a portion of consolidated material 20 showing grains 22 having grain boundaries 24, and sub-grains 26 having sub-grain boundaries 28. Consolidated material 20 includes varying intermetallics or alloys from grain to grain and/or from sub-grain to sub-grain. Such inhomogeneous or non-uniform internal substructure provides for tailoring of the granular and bulk properties of consolidated material 20. In some such embodiments, consolidated material 20 may have an internal substructure having ultra-fine grains and sub-grains that provide an increase in the hardness and wear resistance of consolidated material 20. FIG. 5B depicts some additional, exemplary microstructures of consolidated materials 20a, 20b, and 20c.

In some embodiments, such inhomogeneous or nonuniform internal substructure may be provided to consolidated material 20 by mechanically crushing (e.g., milling) metal powder blend 18 prior to consolidation into consolidated material 20 (e.g., consolidation into a solid article or part). In some such embodiments, crushing or milling of metal powder blend 18 is performed at ambient temperature, or at a temperature below ambient temperature, such as at a cryogenic temperature.

Consolidated Material—Articles

In some embodiments, after consolidation, consolidated material 20 is in the form and shape of an article of manufacture (article or consolidated article). In other embodiments, after consolidation, consolidated material 20 is further processed into the form and shape of an article. The articles may be formed by a thermal process, with or without the application of pressure. In some embodiments, the articles are formed via solid-state processing, such as additive manufacturing. The articles formed of consolidated material 20 may be rigid, solid parts, components, or tools.

Examples of articles that may be composed fully, or at least partially, of consolidated material 20 include, but are not limited to: bushings; bearings, including thrust bearings and radial bearings; shafts, including rotatable shafts; linear transmission rods (actuators); well heads; blow out preventers; chokes; manifolds; valves, including frac pump valves; valve trunnions; valve seats, including frac pump valve seats; valve receptacles; inflow control devises (ICDs); hollow cylindrical sleeves, including perforated hollow cylindrical sleeves; face seals; impellers; slingers; stages; stabilizers; pads; drill bits, including drill bit bodies, nozzles, bearings, bushings or sealing surfaces; LWD and MWD components; mud motors; turbines; rotary steerable system components; reamers; fishing tools; junk mills; coring tools; wheels; gears; stingers; cutters; other flow control equipment; other drilling equipment; other oilfield tools and components and parts; subsea tools, components and parts; and mining tools, components, and parts.

Figure 6B:
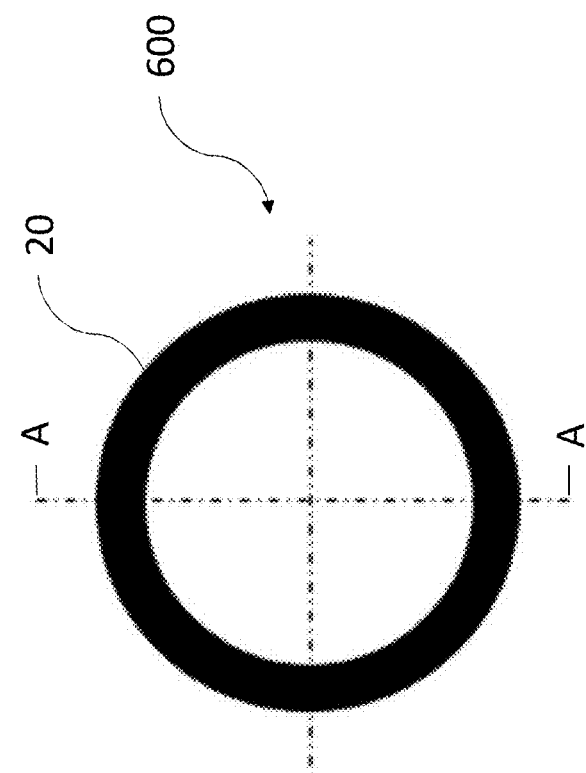
FIG. 6B depicts an article formed of the consolidated material in accordance with certain embodiments of the present disclosure.
Figure 6A:
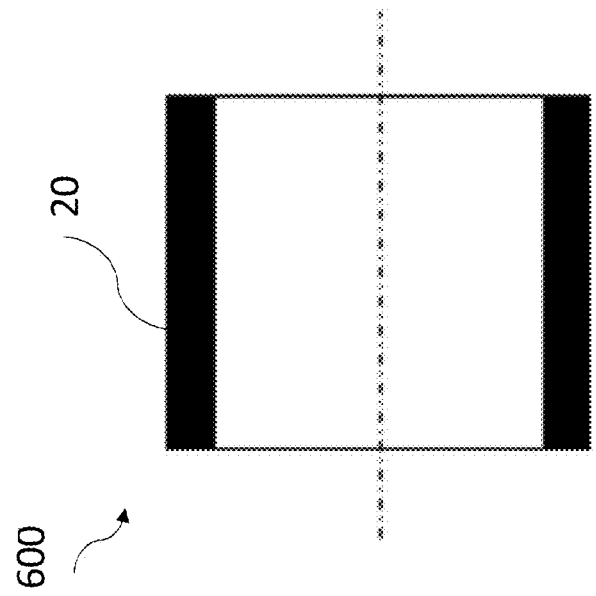
FIG. 6A depicts a cross-sectional view of an article along line A-A of FIG. 6B in accordance with certain embodiments of the present disclosure.

In some embodiments, the article is composed entirely of consolidated material 20, such that 100 wt. % or substantially 100 wt. % or at least 99.5 wt. % of the article is composed of consolidated material 20, based on the total weight of the article. FIGS. 6A and 6B depict an article, tubular 600, made entirely of consolidated material 20.

In other embodiments, the article is only partially composed of consolidated material 20, such that less than 100 wt. %, or less than 99.5 wt. %, or less than 99 wt. %, or less than 98 wt. %, or less than 95 wt. %, or less than 90 wt. %, or less than 80 wt. %, or less than 70 wt. %, or less than 60 wt. %, or less than 50 wt. %, or less than 40 wt. %, or less than 30 wt. %, or less than 20 wt. %, or less than 10 wt. % of the article is composed of consolidated material 20, based on the total weight of the article. In some such aspects, a part made of a second material, that is different than consolidated material 20, may be coated or cladded or otherwise supplemented with consolidated material 20. For example, a preform (e.g., a preformed wrought or cast body) may be supplemented by consolidated material 20. Consolidated material 20 may be applied to the preform by a powder-metallurgy process, such as additive manufacturing. In some such embodiments, the article is composed of a plurality or majority weight percent of the second material. In other such embodiments, the article is composed of a plurality or majority weight percent of consolidated material 20. Second material may be a material that is conventionally used to form oilfield tools, components or parts, such as steel, nickel, or titanium.

FIGS. 7A and 7B depict an article, tubular 700, made partially of consolidated material 20 and partially of second material 710. Tubular 700 includes a body composed of second material 710 that is partially clad with cladding composed of consolidated material 20.

As such, consolidated material 20 may be used to expand an existing tool, part, or component, such as by being combined with a second material to form a multifunctional part that is coated or cladded with consolidated material 20.

In certain embodiments, the article is a tool, part, or component that is electrically or magnetically actuated (e.g., via inductive coupling), such as an electrically or magnetically actuated impeller, and consolidated material 20 is responsive to electromagnetism for actuation of the article.

In some embodiments, an article composed entirely or partially of consolidated material 20, when deployed in the oilfield, is in contact with another article that is composed entirely or partially of consolidated material 20 or another material.

Some embodiments include a method of using the articles. The method may include deploying an article composed entirely or partially of consolidated material 20 in a land-based oilfield or an offshore drilling site, such as in a downhole or subsea environment. In some aspects, the article is deployed such that the article is in contact (e.g., frictionally engaged) with another article that is composed entirely or partially of consolidated material 20 or another material. In some embodiments, the article is electrically conductive, and the method includes transmitting an electrical signal to or through the article. In some embodiments, the article is electrically or magnetically actuable, and the method includes electrically or magnetically actuating the article (e.g., actuating the rotation of a pump impeller).

FIG. 8 depicts a schematic of process 8000 of forming the metal powder composition, consolidated material, and article. The process includes providing first component 10 and second component 12 to blending apparatus 800 and blending first component 10 and second component 12 therein, forming metal powder blend 18. Metal powder blend 18 is transferred to mill 810, where metal powder blend 18 is mechanically crushed, forming crushed metal powder blend 18a having a nonuniform internal structure. Crushed metal powder blend 18a is transferred to into sold-state sintering apparatus 820, within which crushed metal powder blend 18a is sintered, forming consolidated material 20. Consolidated material 20 may be in the form and shape of an article suitable for deployment in an oilfield application. However, in some aspects consolidated material 20 is transferred to solid-state forming apparatus 830 for forming and shaping consolidated material 20 into article 840 suitable for deployment in an oilfield application.

Although the present embodiments and advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A consolidated powder-metallurgy material comprising:
   a plurality of particles of a first component consolidated via sintering with a plurality of particles of a second component;
   wherein the first component comprises a transition metal selected from group 5 or group 6, of the periodic table of the elements, or an alloy thereof;
   wherein the second component is a solid lubricant;
   wherein the consolidated powder-metallurgy material has an internal substructure in which the consolidated powder-metallurgy material varies in composition and properties along grain or sub-grain boundaries, and wherein the internal substructure is formed by mechanically impacting a mixture comprising the particles of the first component and the particles of the second component; and
   wherein the consolidated powder-metallurgy material comprises a hardness between 80 to 95 HRA; and
   wherein the second component comprises:
      a carbon-based solid lubricant comprising graphite, diamond, carbon nanotubes, fullerene, or graphene; and
      at least one of:
         a metal or alloy comprising at least one of indium or an alloy thereof, tin or an alloy thereof, lead or an alloy thereof, silver or an alloy thereof, gold or an alloy thereof, copper or an alloy thereof, or bismuth or an alloy thereof;
         metal-sulfide compound, a metal-phosphide compound, or a metal-nitride compound; or
         transition metal dichalcogenide; a binary oxide; a ternary oxide, an alkaline-earth fluoride, hexagonal boron nitride, or a MAX phase.

2. The consolidated powder-metallurgy material of claim 1, wherein the consolidated powder-metallurgy material includes at least 50 percent by volume of the first component and at most 50 percent by volume of the second component.

3. The consolidated powder-metallurgy material of claim 1, wherein the particles of the first component include a coating on a surface of the particles, the coating encapsulating the particles.

4. The consolidated powder-metallurgy material of claim 1, wherein the transition metal or alloy of the first component is vanadium or an alloy thereof, chromium or an alloy thereof, zirconium or an alloy thereof, niobium or an alloy thereof, molybdenum or an alloy thereof, hafnium or an alloy thereof, tantalum or an alloy thereof, tungsten or an alloy thereof.

5. The consolidated powder-metallurgy material of claim 1, wherein the second component comprises:
   a post-transition metal or a metalloid; and
   a metal and a non-metal, wherein the metal and the non-metal have an electronegativity difference that is greater than 0.5.

6. The consolidated powder-metallurgy material of claim 1, wherein the consolidated powder-metallurgy material is characterized by: a fracture toughness of from 10 to 30

MPax m$^{1/2}$; a TRS in excess of 200 ksi; electrical conductivity; thermal conductivity and diffusivity; or any combination thereof.

7. An article comprising a consolidated powder-metallurgy material, wherein the consolidated powder-metallurgy material comprises a hardness between 80 to 95 HRA, wherein the consolidated powder-metallurgy material includes a plurality of particles of a first component consolidated via sintering with a plurality of particles of a second component, wherein the consolidated powder-metallurgy material has an internal substructure comprising varying intermetallics or alloys from grain to grain or sub-grain to sub-grain, and wherein the internal substructure is formed by mechanically impacting a mixture comprising the particles of the first component and the particles of the second component at a cryogenic temperature;
   wherein the first component comprises a transition metal selected from group 5 or group 6 of the periodic table of the elements, or an alloy thereof; and
   wherein the second component comprises:
      a carbon-based solid lubricant comprising at least one of graphite, diamond, carbon nanotubes, fullerene, or graphene; and
      at least one of:
         a metal or alloy comprising at least one of indium or an alloy thereof, tin or an alloy thereof, lead or an alloy thereof, silver or an alloy thereof, gold or an alloy thereof, copper or an alloy thereof, or bismuth or an alloy thereof;
         metal-sulfide compound, a metal-phosphide compound, or a metal-nitride compound; or
         transition metal dichalcogenide; a binary oxide; a ternary oxide, an alkaline-earth fluoride, hexagonal boron nitride, or a MAX phase.

8. The article of claim 7, wherein the article is an oilfield tool, component, or part; a subsea tool, component, or part; or a mining tool, component, or part.

9. The article of claim 7, wherein the article is composed of the consolidated powder-metallurgy material and a second material that is different than the consolidated powder-metallurgy material.

10. The article of claim 7, wherein the article is an electrically or magnetically actuated tool.

11. A method comprising:
   prior to the consolidating, blending a first plurality of particles of a first component with a second plurality of particles of a second component, forming a metal powder blend, wherein the metal powder blend is consolidated;
   after the blending and prior to the consolidating, crushing the metal powder blend at a cryogenic temperature;
   consolidating via sintering the first plurality of particles of the first component with the second plurality of particles of the second component, forming a consolidated powder-metallurgy material;
   wherein the first component comprises a transition metal selected from group 5 or group 6 of the periodic table of the elements, or an alloy thereof;
   wherein the second component comprises:
      a carbon-based solid lubricant comprising at least one of graphite, diamond, carbon nanotubes, fullerene, or graphene; and
      at least one of:
         a metal or alloy comprising at least one of indium or an alloy thereof, tin or an alloy thereof, lead or an alloy thereof, silver or an alloy thereof, gold or an alloy thereof, copper or an alloy thereof, or bismuth or an alloy thereof;
         metal-sulfide compound, a metal-phosphide compound, or a metal-nitride compound; or
         transition metal dichalcogenide; a binary oxide; a ternary oxide, an alkaline-earth fluoride, hexagonal boron nitride, or a MAX phase; and
   wherein the consolidated powder-metallurgy material has an internal substructure in which the consolidated powder-metallurgy material varies in composition and properties along grain or sub-grain boundaries.

12. The method of claim 11, wherein the consolidating includes sintering the particles of the first and second components.

13. The method of claim 11, further comprising forming an article from the consolidated powder-metallurgy material.

14. The method of claim 13, wherein forming the article includes solid-state processing the consolidated powder-metallurgy material.

15. The method of claim 13, wherein forming the article includes coating or cladding an article body with the consolidated powder-metallurgy material.

16. The consolidated powder-metallurgy material of claim 1, wherein the internal substructure comprises varying intermetallics or alloys from grain to grain, sub-grain to sub-grain, or a combination thereof.

17. The article of claim 7, wherein the transition metal or alloy of the first component comprises tungsten or an alloy thereof.

18. The method of claim 11, wherein the first component comprises tungsten or an alloy thereof.

19. The consolidated-powder metallurgy material of claim 1, wherein the first component comprises tungsten.

* * * * *